United States Patent
Koizumi et al.

(10) Patent No.: US 7,067,353 B2
(45) Date of Patent: Jun. 27, 2006

(54) METHOD FOR MANUFACTURING SEMICONDUCTOR PACKAGE HAVING ELECTRODES PENETRATING THROUGH SEMICONDUCTOR WAFER

(75) Inventors: Naoyuki Koizumi, Nagano (JP); Kei Murayama, Nagano (JP); Takashi Kurihara, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/826,034

(22) Filed: Apr. 16, 2004

(65) Prior Publication Data

US 2004/0259351 A1    Dec. 23, 2004

(30) Foreign Application Priority Data

Jun. 19, 2003   (JP) .............................. 2003-174473

(51) Int. Cl.
*H01L 21/44*    (2006.01)
(52) U.S. Cl. ...................... 438/110; 257/734; 257/735; 257/736
(58) Field of Classification Search ................ 257/774, 257/620, 734; 438/106–110, 456–460, 243, 438/270
See application file for complete search history.

(56) References Cited

U.S. PATENT DOCUMENTS

| | | | |
|---|---|---|---|
| 6,221,769 B1 | 4/2001 | Dhong et al. | |
| 6,225,651 B1 | 5/2001 | Billon | |
| 6,294,837 B1 | 9/2001 | Akram et al. | |
| 6,603,190 B1* | 8/2003 | Kosaki et al. | 257/618 |
| 2002/0070429 A1* | 6/2002 | Wester | 257/620 |
| 2003/0011070 A1 | 1/2003 | Iijima et al. | |
| 2003/0116857 A1* | 6/2003 | Taniguchi et al. | 257/774 |

FOREIGN PATENT DOCUMENTS

JP    10-223833    8/1998

* cited by examiner

*Primary Examiner*—Hoai Pham
*Assistant Examiner*—Nathan W. Ha
(74) *Attorney, Agent, or Firm*—Ladas & Parry LLP

(57) ABSTRACT

A method for manufacturing a semiconductor package, the method including the steps of attaching a bottom surface of a semiconductor wafer to a first supporting member, forming a through hole in the semiconductor wafer, separating the semiconductor wafer from the first supporting member, forming an insulating layer on at least the bottom surface of the semiconductor wafer and the inner wall of the through hole, forming a conducting layer underneath the semiconductor wafer, the conducting layer spanning at least the bottom of the through hole; and forming a conductive member in the through hole and in electrical contact with the conducting layer.

11 Claims, 10 Drawing Sheets

METHOD FOR MANUFACTURING SEMICONDUCTOR PACKAGE HAVING ELECTRODES PENETRATING THROUGH SEMICONDUCTOR WAFER

BACKGROUND OF THE INVENTION

1. Field of the Invention

The present invention generally relates to a method for manufacturing a semiconductor package having electrodes penetrating through a semiconductor wafer.

2. Description of the Related Art

A package for mounting a semiconductor chip (hereinafter referred to as "semiconductor package") has an electrode (penetration electrode) penetrating therethrough for electrically connecting a semiconductor chip and a substrate. Conventional examples are shown in Japanese Laid-Open Patent Application Nos. 2003-31719 and 10-223833.

In recent years, as the heat releasing values increases along with the increase in energy consumption of an MPU (Micro Processing Unit), and as the number of pins serving as external connecting terminals increases, there is a greater demand in employing a material having little thermal expansion and being able to be micro fabricated, as a material for the semiconductor package. In response to such demand, a semiconductor such as silicon is proposed as the material for the semiconductor package.

FIGS. 1 through 9 are cross-sectional views illustrating a conventional process (method) for manufacturing a semiconductor package. In a first process shown in FIG. 1, resist 520 having holes 522 is formed on a top surface of a silicon wafer 510. Next, in a second process shown in FIG. 2, holes 512 are formed by dry etching in portions of the silicon wafer 510 exposed where the holes 522 of the resist 520 are situated. Next, in a third process shown in FIG. 3, the resist 520 formed on the top surface of the silicon wafer 510 is removed.

In a fourth process shown in FIG. 4, an insulating layer 530 is formed by a thermal oxidation method or a CVD (Chemical Vapor Deposition) method on the surface of the silicon wafer 510 (including inner wall portions of the holes 512). It is to be noted that the insulating layer 530 is not always required to be formed at the bottom surface of the silicon wafer 510. Next, in a fifth process shown in FIG. 5, a seed layer 540, which is required during a plating process, is formed by a CVD method or a sputtering method on the top surface of the insulating layer 530 formed on the top surface of the silicon wafer 510 and the holes 512. Next, in a sixth process as shown in FIG. 6, the inner portions of the holes 512 are filled with conductors by plating, to thereby obtain electrodes 550. In a seventh process shown in FIG. 7, exposed portions of the seed layer 540 are detached (separated).

Next, in an eighth process shown in FIG. 8, a thin-filming process (thin-filming) is performed on the silicon wafer 510, thereby exposing the electrodes 550 at the bottom surface of the silicon wafer 510. More specifically, in performing the thin-filming process on the silicon wafer 510, first, the bottom surface of the silicon wafer 510 is polished with, for example, a grind stone; then, the silicon wafer 510 is removed by a wet etching method until reaching a state immediately before the electrodes 550 become exposed; and then, finally, the bottom surface of the silicon wafer 510 is polished with, for example, a cloth containing a polishing agent, thereby exposing the electrodes 550 at the bottom surface of the silicon wafer 510.

Next, in a ninth process as shown in FIG. 9, an insulating layer 560 is formed on the bottom surface of the silicon wafer 510 in a manner exposing the electrodes 550. Accordingly, the electrodes (penetration electrodes) 550, penetrating the silicon wafer 510 from its top to bottom surface, are obtained for enabling a top portion thereof to be electrically connected to a semiconductor chip, and a bottom portion thereof to be electrically connected to a mounting substrate.

However, in the above-described conventional method, residue from the conductor, that is the material of the electrodes 550, may adhere to the bottom surface of the silicon wafer 510 during the eighth process (FIG. 8) where the bottom surface of the silicon wafer 510 is polished with the cloth containing a polishing agent. This may lead to shorting between the electrodes 550. Furthermore, in the ninth process (FIG. 9), forming the insulating layer 560 in a manner exposing the electrodes 550 is difficult since the electrodes 550 have extremely small diameters, for example, approximately 15 μm.

SUMMARY OF THE INVENTION

It is a general object of the present invention to provide a method for manufacturing a semiconductor package that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method for manufacturing a semiconductor package particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method for manufacturing a semiconductor package, the method including the steps of: attaching a bottom surface of a semiconductor wafer to a first supporting member; forming a through hole in the semiconductor wafer; separating the semiconductor wafer from the first supporting member; forming an insulating layer on at least the bottom surface of the semiconductor wafer and the inner wall of the through hole; forming a conducting layer underneath the semiconductor wafer, the conducting layer spanning at least the bottom of the through hole; and forming a conductive member in the through hole and in electrical contact with the conducting layer.

According to an embodiment of the present invention, the method may further include a step of thin-filming the semiconductor wafer.

According to an embodiment of the present invention, the conductive member may be formed by plating.

According to an embodiment of the present invention, the method may further include a step of removing at least a portion of the conducting layer.

According to an embodiment of the present invention, a portion of the conducting layer beneath the conducting member may be left remaining in the step of removing at least a portion of the conducting layer.

According to an embodiment of the present invention, the conducting layer may be a tape member.

According to an embodiment of the present invention, the through hole is formed by etching.

According to an embodiment of the present invention, wherein the insulating layer may be formed on the surface of the semiconductor wafer by forming an inorganic insulating layer on the surface of the semiconductor wafer, and forming an organic insulating layer on the surface of the inorganic insulating layer.

According to an embodiment of the present invention, wherein a barrier layer may be formed on the insulating layer subsequent to the step of forming the insulating layer.

Furthermore, the present invention provides a method for manufacturing a semiconductor package, the method including the steps of: attaching a bottom surface of a semiconductor wafer to a first supporting member; forming a through hole in the semiconductor wafer; separating the semiconductor wafer from the first supporting member; forming an insulating layer on at least the bottom surface of the semiconductor wafer and the inner wall of the through hole; attaching the semiconductor wafer to a top surface of a second supporting member, the top surface spanning at least the bottom of the through hole; forming a conducting layer on at least the bottom of the through hole; and forming a conductive member in the through hole.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings. FIGS. 10 through 16 are cross-sectional views illustrating a first to seventh process of a method (process) for manufacturing a semiconductor package according to an embodiment of the present invention.

Figure 1:
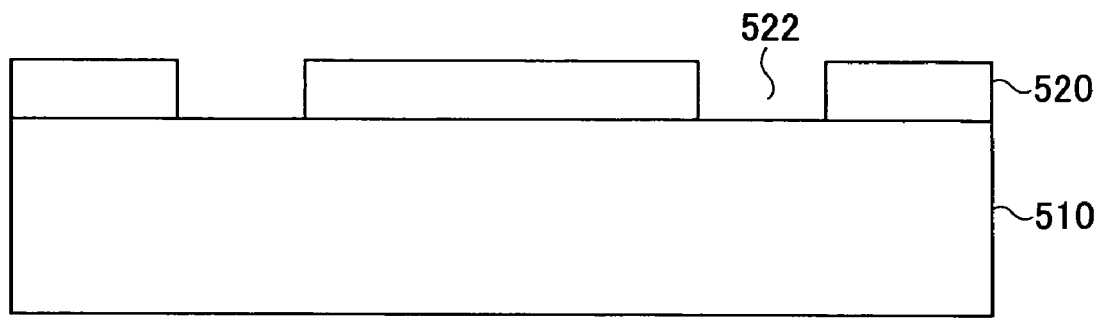
FIG. 1 is a cross-sectional view showing a first process of a conventional method for manufacturing a semiconductor package.
Figure 2:
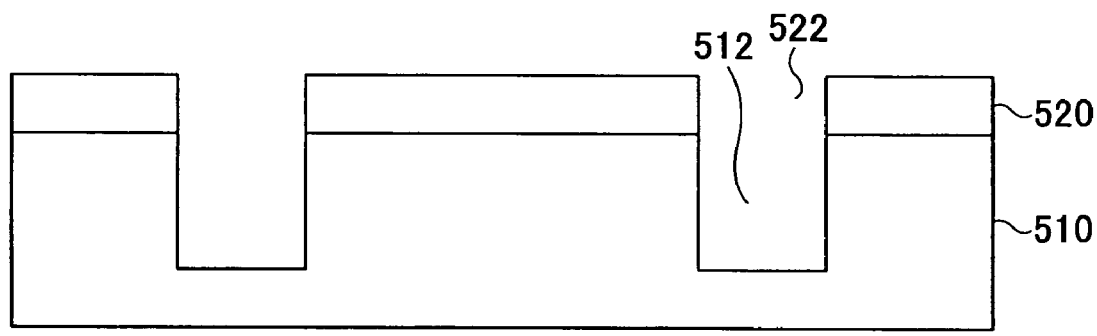
FIG. 2 is a cross-sectional view showing a second process of a conventional method for manufacturing a semiconductor package.
Figure 3:
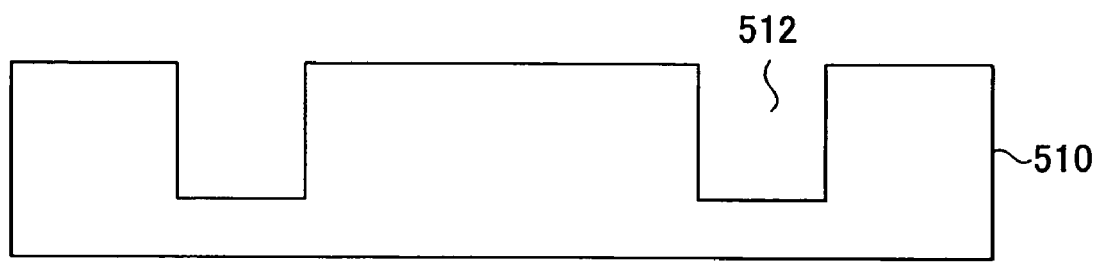
FIG. 3 is a cross-sectional view showing a third process of a conventional method for manufacturing a semiconductor package.
Figure 4:
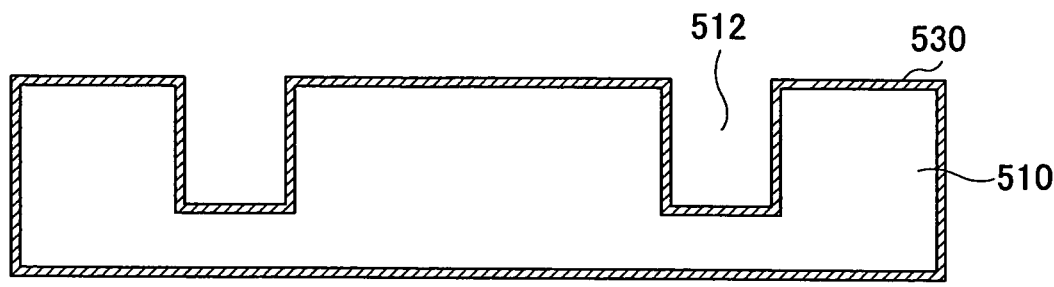
FIG. 4 is a cross-sectional view showing a fourth process of a conventional method for manufacturing a semiconductor package.
Figure 5:
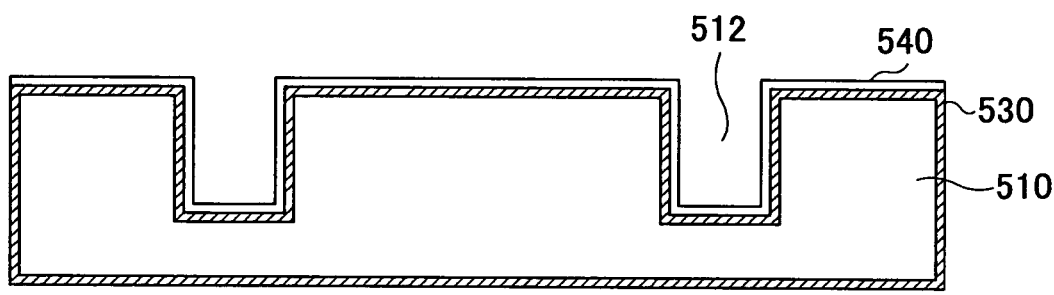
FIG. 5 is a cross-sectional view showing a fifth process of a conventional method for manufacturing a semiconductor package.
Figure 6:
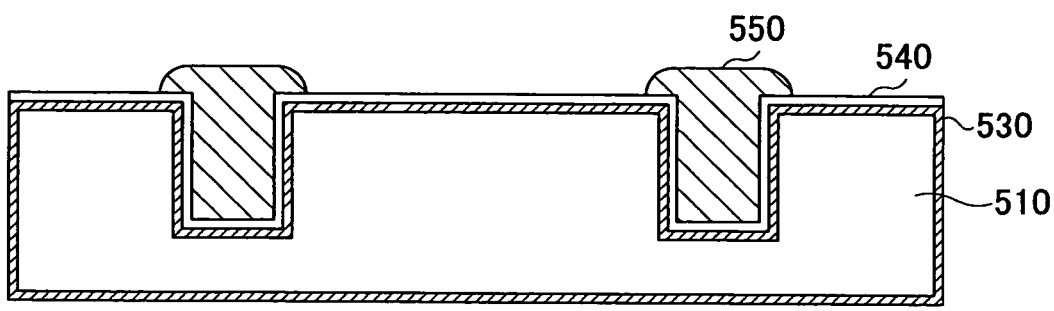
FIG. 6 is a cross-sectional view showing a sixth process of a conventional method for manufacturing a semiconductor package.
Figure 7:
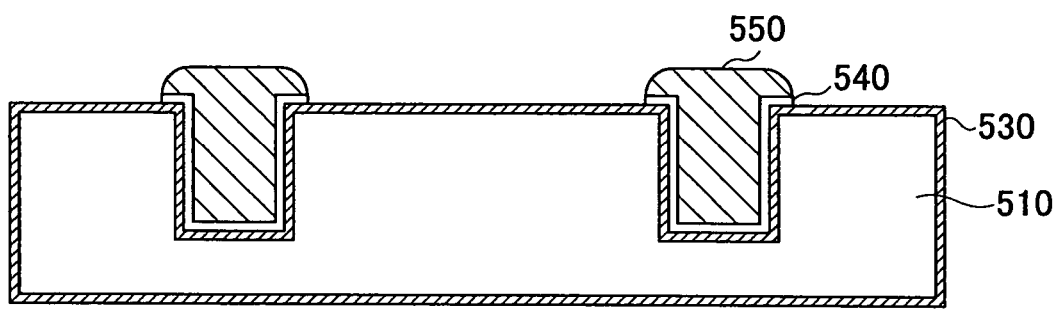
FIG. 7 is a cross-sectional view showing a seventh process of a conventional method for manufacturing a semiconductor package.
Figure 8:
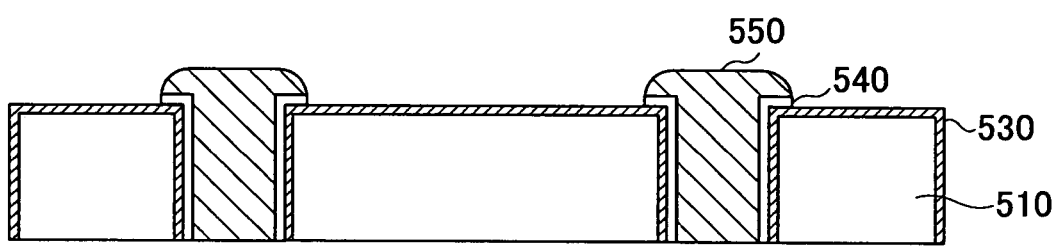
FIG. 8 is a cross-sectional view showing a eighth process of a conventional method for manufacturing a semiconductor package.
Figure 9:
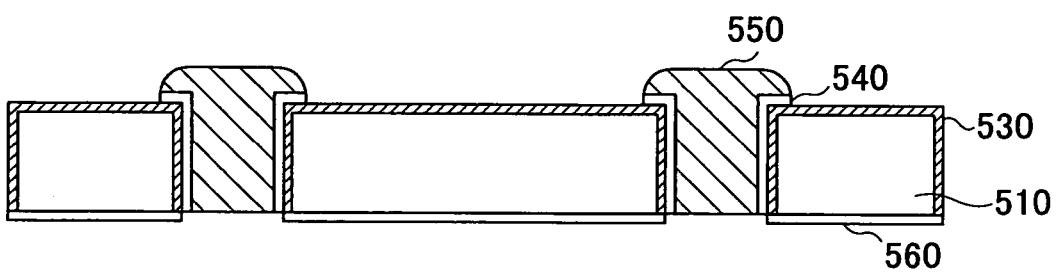
FIG. 9 is a cross-sectional view showing a ninth process of a conventional method for manufacturing a semiconductor package.
Figure 10:
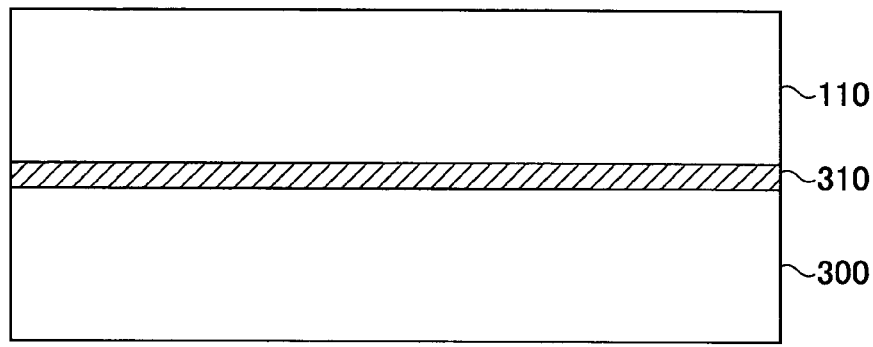
FIG. 10 is a cross-sectional view showing a first process of a method for manufacturing a semiconductor package according to an embodiment of the present invention.
Figure 11:
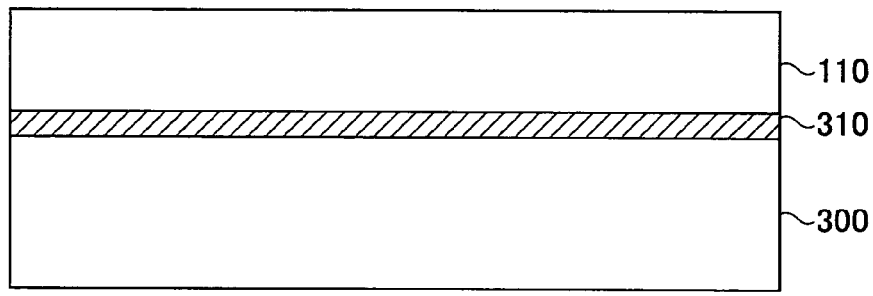
FIG. 11 is a cross-sectional view showing a second process of a method for manufacturing a semiconductor package according to an embodiment of the present invention.

In the first process shown in FIG. 10, a silicon wafer 110 is disposed on a top surface of a supporting member 300 (e.g. glass substrate) via a bonding layer 310. It is to be noted that a semiconductor circuit may be provided to the silicon wafer 110. In a second process shown in FIG. 11, a process of forming the silicon wafer 110 into a thin film is performed (thin-filming). In an exemplary thin-filming process of the silicon wafer 110, a top surface of the silicon wafer 110 is polished with a grind stone, and then the top surface of the silicon wafer 110 is polished with a cloth containing a polishing agent. The silicon wafer 110, resulting from the thin-filming process, has a thickness of, for example, approximately 100 µm.

Figure 12:
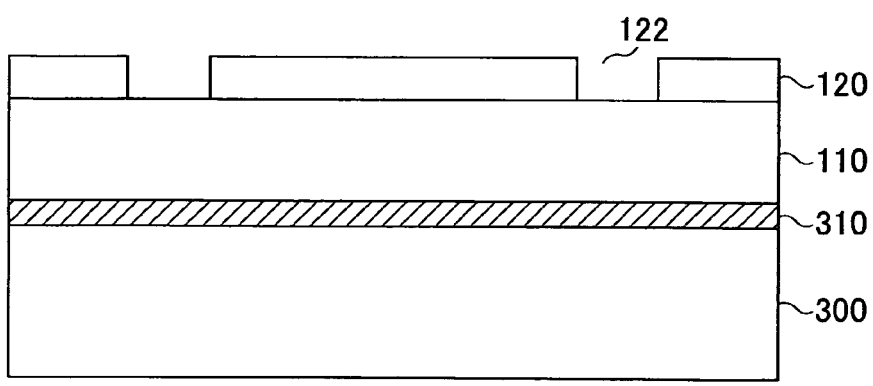
FIG. 12 is a cross-sectional view showing a third process of a method for manufacturing a semiconductor package according to an embodiment of the present invention.

In a third process shown in FIG. 12, resist 120 having holes 122 is formed on a top surface of the thin-filmed silicon wafer 110. The holes 122 are situated at portions of the silicon wafer 110 where through holes 112 (described below) are to be formed. The holes 122 are formed in an exemplary process described below. First, a film resist 120 is adhered to the top surface of the silicon wafer 110 by thermocompression. Next, a mask (not shown) is disposed above the resist 120 for conducting exposure and development. Finally, the resist 120 disposed on a top portion of the silicon wafer 110, at which through holes 112 are to be formed, is removed to thereby obtain the holes 122.

Figure 13:
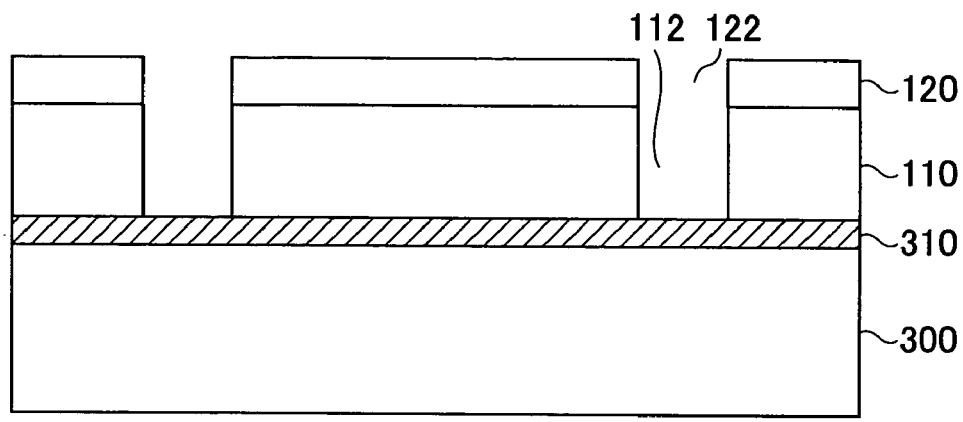
FIG. 13 is a cross-sectional view showing a fourth process of a method for manufacturing a semiconductor package according to an embodiment of the present invention.

In a fourth process shown in FIG. 13, an etching method, such as a dry etching method or a wet etching method, is employed for forming the through holes 112 (penetration holes) in the silicon wafer 110 at portions where the holes 122 of the resist 120 are situated. The through holes 112 have, for example, diameters of approximately 15 µm.

It is to be noted that, after the second process (FIG. 11), the through holes 112 may be formed without having to dispose the resist 120 on the top surface of the silicon wafer 110 by alternatively employing, for example, a laser process or a mechanical drill. It is, however, preferable to employ an etching method which applies little or no shock in forming the through holes 112 since the silicon wafer 110, being subjected to the thin-filming process, is fragile.

Figure 14:
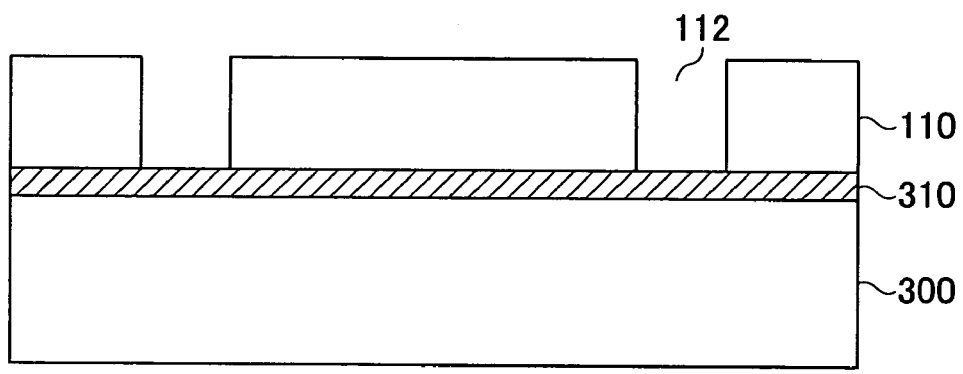
FIG. 14 is a cross-sectional view showing a fifth process of a method for manufacturing a semiconductor package according to an embodiment of the present invention.
Figure 15:
FIG. 15 is a cross-sectional view showing a sixth process of a method for manufacturing a semiconductor package according to an embodiment of the present invention.

In a fifth process shown in FIG. 14, the resist 120 disposed on the top surface of the silicon wafer 110 is removed. Next, in a sixth process shown in FIG. 15, the silicon wafer 110 is separated from the supporting member 300.

Figure 16:
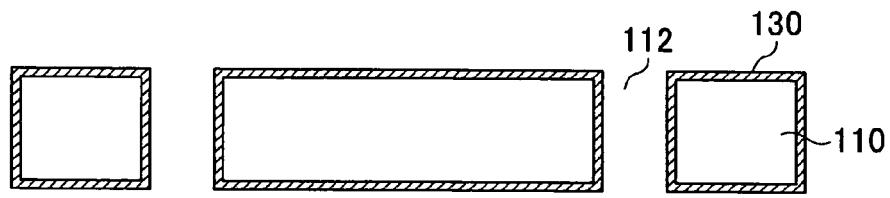
FIG. 16 is a cross-sectional view showing a seventh process of a method for manufacturing a semiconductor package according to an embodiment of the present invention.

In a seventh process shown in FIG. 16, an insulating layer 130 is formed on the surface of the silicon wafer 110 (including an inner wall portion of the through holes 112). In a case where the insulating layer 130 is of an organic material, an electrodeposition method may be used for forming the insulating layer 130.

Figure 17:
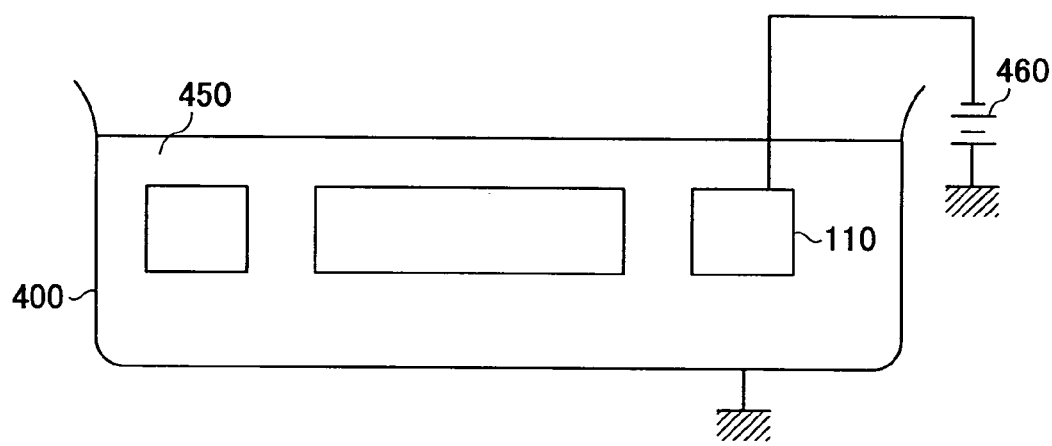
FIG. 17 is a schematic view for describing an electrodeposition method according to an embodiment of the present invention.

FIG. 17 is a schematic view for describing the formation of the insulating layer 130 using an electrodeposition method. In the electrodeposition method, a solution containing an organic resin dispersed in a colloidal state (hereinafter referred to as "electrodeposition solution") 450 is prepared inside an electrolytic tank 400, as shown in FIG. 17, and the silicon wafer 110 is steeped in the electrodeposition solution 450. Then, an electric source 460 applies a prescribed electric voltage between the electrolytic tank 400 and the silicon wafer 110 which respectively serve as electrodes. The applying of electric voltage causes the colloidal organic resin (e.g. epoxy resin) to migrate by electrophoretic migration, thereby enabling the organic resin to coat the surface of the silicon wafer and form the insulating layer 130. It is to be noted that, with the above-described electrodeposition method, the thickness of the insulating layer 130 is in proportion to the voltage applied between the electrolytic tank 400 and the silicon wafer 110, and also in proportion to time. Therefore, the insulating layer 130 can be formed with a desired thickness by suitably adjusting voltage and time.

In a case where the insulating layer 130 is of an inorganic material, a thermal oxidation method or a CVD method, in addition to the electrodeposition method, may alternatively be used. In a case where the thermal oxidation method or the CVD method is used, an $SiO_2$ layer (formed for example by oxidation of the surface of the silicon wafer 110) or an SiN layer may be used as the insulating layer 130.

Next, an eighth process and the processes thereafter are described with the below-given first through third examples of the present invention.

FIRST EXAMPLE

Figure 18:
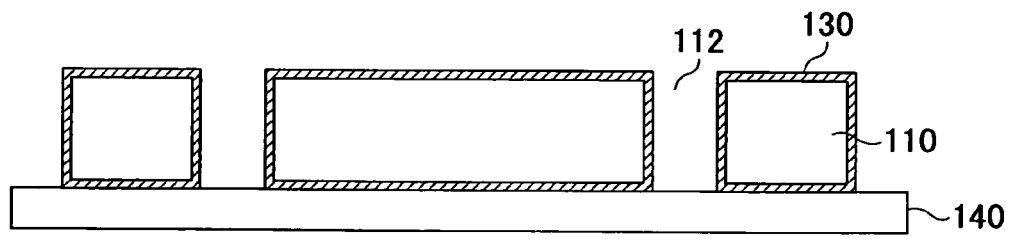
FIG. 18 is a cross-sectional view showing an eighth process of a method for manufacturing a semiconductor package according to a first embodiment of the present invention.

In an eighth process shown in FIG. 18 according to a first example of the present invention, a film conducting layer 140 is disposed beneath the silicon wafer 110 (toward the bottom surface of the silicon wafer 110). Before the insulating layer 130, being formed by the electrodeposition method, is hardened by thermal processing, the conducting layer 140 is pressingly attached to the insulating layer 130. By pressingly attaching the conducting layer 140 to the insulating layer 130, no apparatus using a CVD method or a sputter method need be used, thereby allowing the conducting layer 140 to be formed with ease.

It is to be noted that the conducting layer 140 serves to hold the silicon wafer 110 via the insulating layer and also serves to be a seed layer (feeding layer) used during a plating process (described below). Furthermore, a portion of the conducting layer 140 situated at a lower portion of the through hole 112 serves to be a lower portion of a penetration electrode 160 (described below). As for the material used for the conducting layer 140, there are, for example, an alloy of copper, titanium and tungsten, or a metal plate/foil of titanium nitride.

Figure 19:
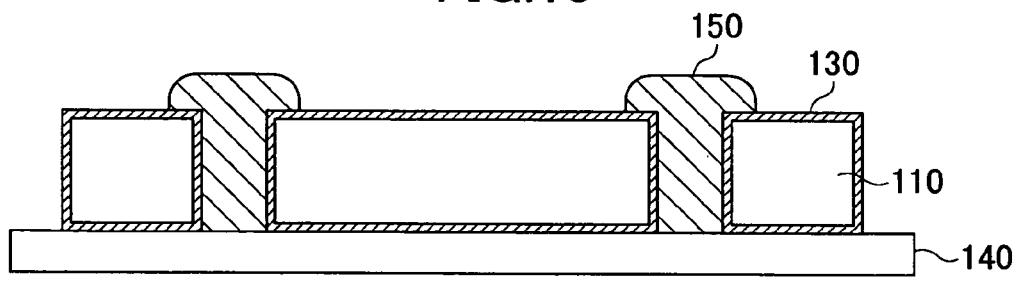
FIG. 19 is a cross-sectional view showing a ninth process of a method for manufacturing a semiconductor package according to the first embodiment of the present invention.

In a ninth process shown in FIG. 19, a conductor 150 is grown at an exposed portion of the conducting layer 140 in a manner filling the through hole 112. A portion of the conductor 150 projects from a top surface of the silicon wafer 110. It is to be noted that an electrolytic plating method or an electroless method is employed in the plating process. The material used for the conductor 150 corresponds to the material used for the conducting layer 140. For example, in a case where the material of the conducting layer 140 is copper, copper is used for the conductor 150, and the conductor 150 is formed by an electrolytic copper plating having the conducting layer 140 as a feeding layer.

Figure 20:
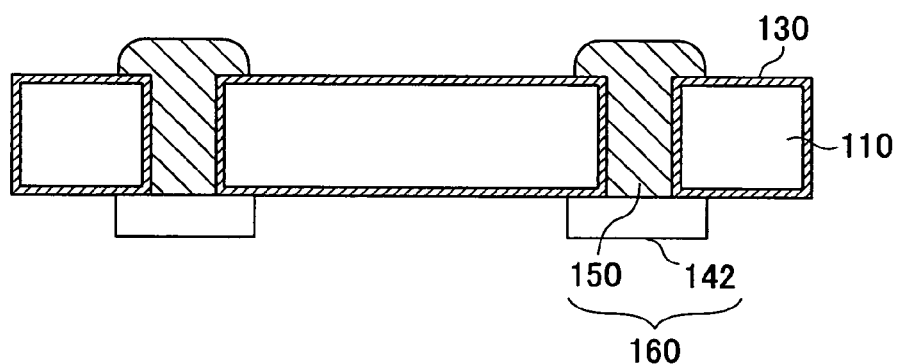
FIG. 20 is a cross-sectional view showing a tenth process of a method for manufacturing a semiconductor package according to the first embodiment of the present invention.

In a tenth process shown in FIG. 20, the conducting layer 140, except for a bottom portion of the conductor 150 (conducting layer portion 142 proximal to said bottom portion of the conductor 150), is removed through a patterning process. As a result of this process, a penetration electrode 160 is formed in a manner penetrating the silicon wafer 110 from a top surface to a bottom surface of the silicon wafer 110. The penetration electrode 160 is disposed between a semiconductor chip (not shown) and a mounting substrate (not shown). A top portion of the penetration electrode 160 is electrically connected to the semiconductor chip and a bottom portion of the penetration electrode 160 is electrically connected to the mounting substrate. It is to be noted that the conducting layer 140 may be etched to form wiring patterns thereto. Furthermore, the conducting layer 140, including the conducting layer portion 142 thereof, may alternatively be entirely removed.

SECOND EXAMPLE

Figure 21:
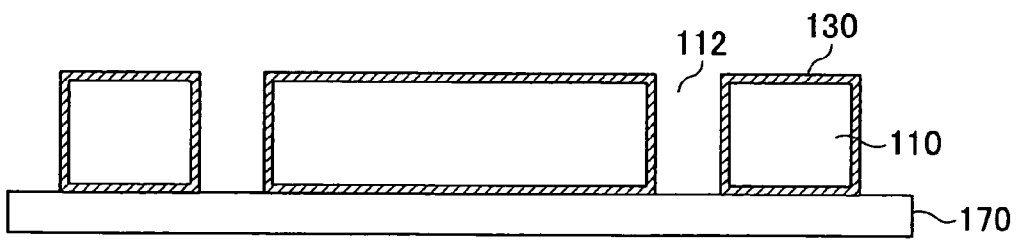
FIG. 21 is a cross-sectional view showing an eighth process of a method for manufacturing a semiconductor package according to a second embodiment of the present invention.

In an eighth process according to a second example of the present invention, as shown in FIG. 21, a conductive tape 170 may be adhered toward a bottom surface side of the silicon wafer 110 (insulating layer). The conductive tape 170, for example, may be a copper foil in which one side thereof is an adhesive layer formed from an adhesive agent blended with nickel particles. Since the adhesive agent is blended with nickel particles, electricity may pass from a top surface to a bottom surface of the conductive tape 170.

It is to be noted that the conductive tape 170, like the conducting layer 140 of the first example, serves to hold the silicon wafer 110 and also serves to be a seed layer (feeding layer) used for a plating process (described below).

Figure 22:
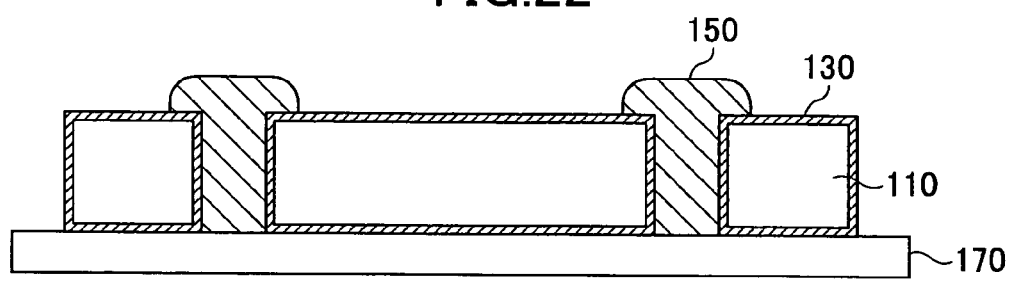
FIG. 22 is a cross-sectional view showing a ninth process of a method for manufacturing a semiconductor package according to the second embodiment of the present invention.

In a ninth process according to a second example of the present invention, as shown in FIG. 22, the conductor 150 is grown at an exposed portion on the conductive tape 170 in a manner filling the through hole 112. A portion of the conductor 150 projects from a top surface of the silicon wafer 110. It is to be noted that an electrolytic plating method or an electroless method may be employed in the plating process. The material used for the conductor 150 corresponds to the material used for the conductive tape 170. For example, in a case where the material of the conductive tape 170 is copper, copper is used for the conductor 150, and the conductor 150 is formed by an electrolytic copper plating having the conductive tape 170 as a feeding layer.

Figure 23:
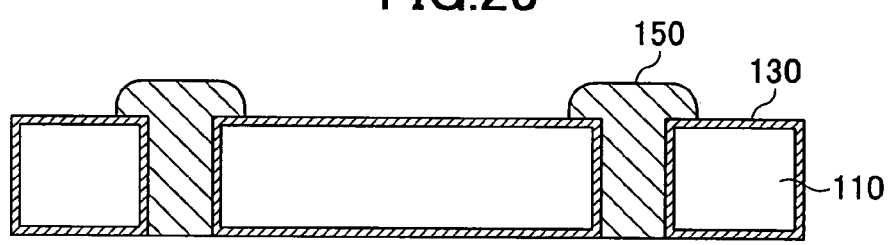
FIG. 23 is a cross-sectional view showing a tenth process of a method for manufacturing a semiconductor package according to the second embodiment of the present invention.

In a tenth process according to the second example of the present invention, as shown in FIG. 23, the conductive tape 170 is peeled off (detached). As a result, a penetration electrode 150 is formed in a manner penetrating the silicon wafer 110 from top to bottom of the silicon wafer 110. In a case where the penetration electrode is desired to project from a bottom surface of the silicon wafer 110, an electrode may be formed in a subsequent process at an exposed portion of the bottom surface of the silicon wafer 110.

THIRD EXAMPLE

Figure 24:
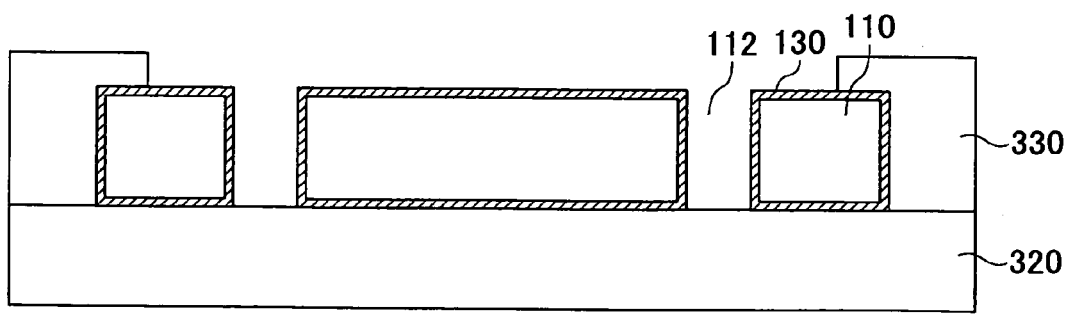
FIG. 24 is a cross-sectional view showing an eighth process of a method for manufacturing a semiconductor package according to a third embodiment of the present invention.

In an eighth process according to a third example of the present invention, as shown in FIG. 24, the silicon wafer 110 is disposed at a top surface of a supporting member 320, such as a glass substrate. The silicon wafer 110 is mounted to the supporting member 320 by having a surrounding thereof temporarily fixed by a tape 330.

Figure 25:
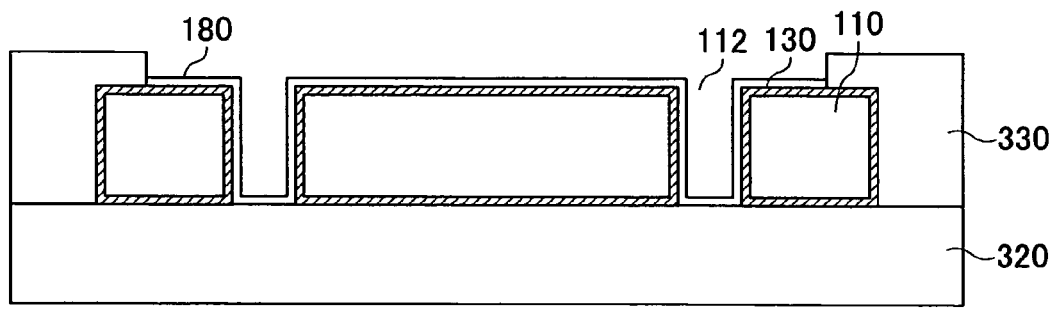
FIG. 25 is a cross-sectional view showing a ninth process of a method for manufacturing a semiconductor package according to the third embodiment of the present invention.

In a ninth process according to the third example of the present invention, as shown in FIG. 25, a seed layer (feeding layer) 180, which is used for a plating process, is formed on exposed portions of the insulating layer 130. For example, the seed layer 180 may be formed by forming a chrome layer, and further forming a copper layer by sputtering or electroless plating. Alternatively, the seed layer 180 may be formed by forming a titanium layer, and further forming a copper layer by sputtering or electroless plating.

Figure 26:
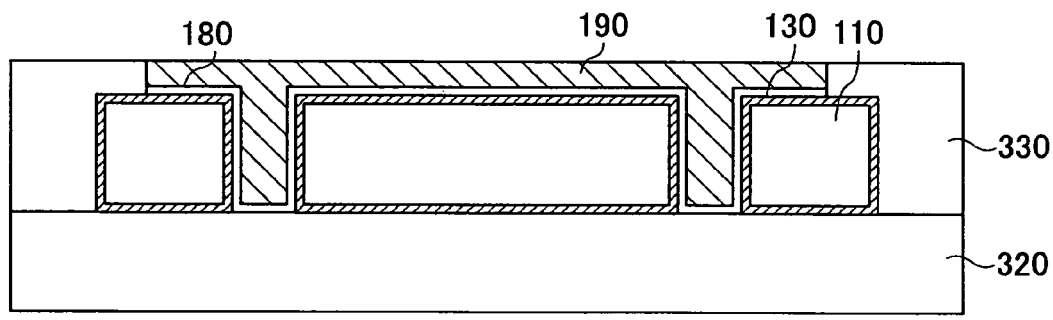
FIG. 26 is a cross-sectional view showing a tenth process of a method for manufacturing a semiconductor package according to the third embodiment of the present invention.

In a tenth process according to the third example of the present invention, as shown in FIG. 26, a conductor 190 is formed on a top surface of the seed layer 180. It is to be noted that, an electrolytic plating method or an electroless method is employed in the plating process, like the first and second examples.

Figure 27:
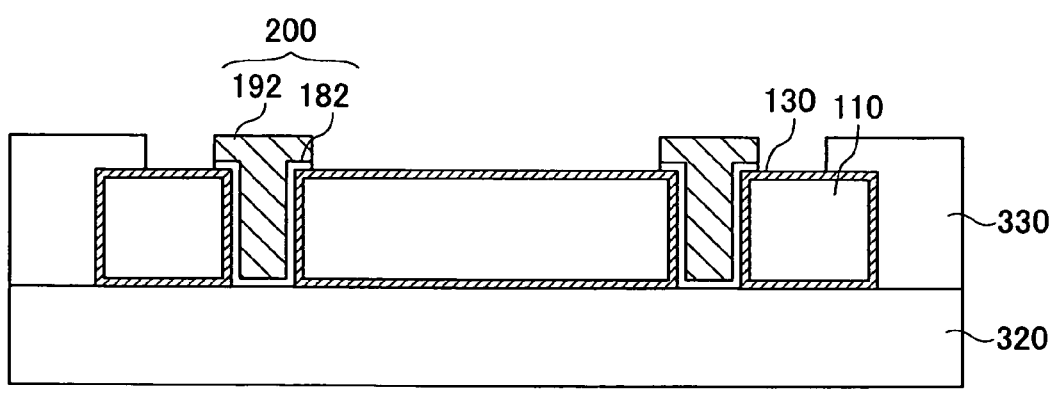
FIG. 27 is a cross-sectional view showing an eleventh process of a method for manufacturing a semiconductor package according to the third embodiment of the present invention.

In an eleventh process according to the third example of the present invention, as shown in FIG. 27, a patterning process is performed for removal of the conductor 190, except for a conductor part 192 inside the through hole 112, and for the removal of the seed layer 180, except for a seed layer part 182 inside the through hole 112. As a result of this process, the conductor part 192 and the seed layer part 182 form a penetration electrode 200 that penetrates the silicon wafer 110 from its' top surface to bottom surface. Then, the silicon wafer 110 is detached from the tape 330 and the supporting member 320. It is to be noted that in a case where the penetration electrode 200 is required to project from the lower surface of the silicon wafer 110, an electrode may be formed at a bottom part of the seed layer 182 which is exposed towards the bottom surface side of the silicon wafer 110.

As a consequence, with the method (process) of manufacturing a semiconductor package according to an embodiment of the present invention, conductors (numeral 150 in the first and second examples, numeral 192 in the third example) serving as penetration electrodes are formed inside the through holes 112 of the silicon wafer 110 after a process of thin-filming the silicon wafer 110, unlike the conventional method (process) of manufacturing a semiconductor package where a thin-filming process was performed after the formation of penetration electrodes. Therefore, little or no residue of the conductors 150, 192 adheres to the surface of the silicon wafer 110 during a thin-filming process of the silicon wafer 110, thereby preventing or at least reducing the likelihood of shorting between the penetration electrodes.

Furthermore, since the insulating layer 130 is disposed on the surface of the silicon wafer 110 after the thin-filming process of the silicon wafer 110 according to an embodiment of the present invention, there is no requirement of disposing an insulating layer at a bottom surface of a semiconductor wafer unlike a conventional process (method). Therefore, penetration electrodes may be easily disposed in a manner exposed toward a bottom surface side of the silicon wafer 110.

Furthermore, according to the second example of the present invention, removal of the conducting layer, after the formation of penetration electrodes, can be easily performed by employing the conductive tape 170 as the conducting layer. Breakage of the thin-filmed silicon wafer 110 can be prevented by using an etching method instead of using mechanical drills or the like for forming through holes in the silicon wafer 110. Furthermore, an organic material, which may be vulnerable to heat, can be employed as the insulating layer 130 by using an electrodeposition method for disposing the insulating layer 130 on the surface of the silicon wafer 110.

It is to be noted that although the silicon wafer 110 is employed as a semiconductor wafer in the above-described embodiment of the present invention, other semiconductor wafers may alternatively be employed on condition that, for example, the semiconductor wafer has little thermal expansion property and is able to be micro fabricated.

Figure 28:
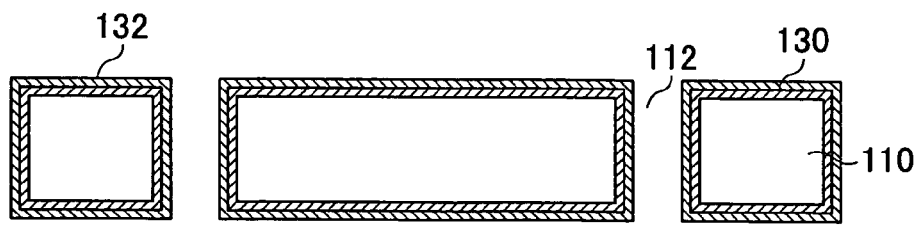
FIG. 28 is a cross-sectional view showing a seventh process of a method for manufacturing a semiconductor package according to another embodiment of the present invention.

It is to be noted that in the seventh process shown in FIG. 16, where an inorganic insulating layer 130 is formed with a thermal oxidation method or a CVD method, an organic insulating layer 132 may be formed on the surface of the inorganic insulating layer 130 by using an electrodeposition method as shown in FIG. 28. In this case, insulation reliability can be improved compared to a case where merely the inorganic insulating layer 130 is formed.

Figure 29:
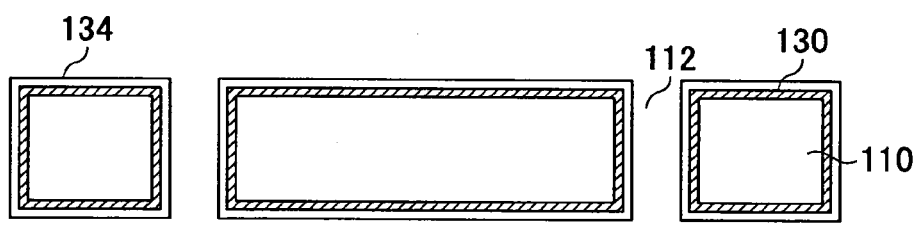
FIG. 29 is a cross-sectional view showing another exemplary eighth process of a method for manufacturing a semiconductor package according to the first embodiment of the present invention.
Figure 30:
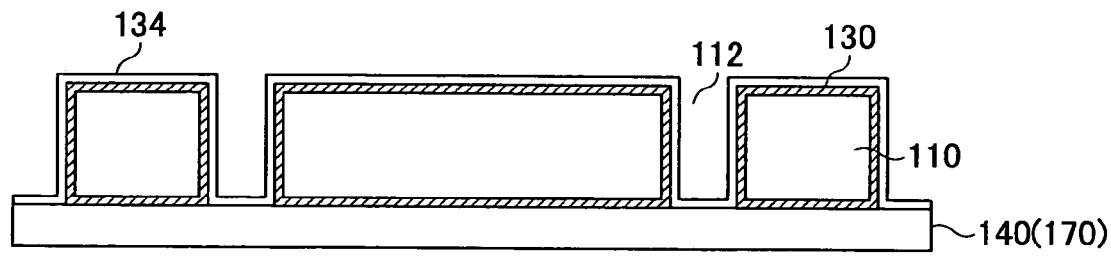
FIG. 30 is a cross-sectional view showing another exemplary eighth process of a method for manufacturing a semiconductor package according to the second embodiment of the present invention.

Furthermore, in the seventh process shown in FIG. 16, a barrier layer 134 may be formed on the surface of the insulating layer 130 as shown in FIG. 29. Alternatively, the barrier layer 134 may be formed on the surface of the insulating layer 130 in the eighth process in the first example (FIG. 18) or the eighth process in the second example (FIG. 21) in a manner shown in FIG. 30. Subsequent to the formation of the conductor 150, the barrier layer 134 may be removed while the portion, at which the conductor 150 is formed, is left to remain.

The barrier layer may be formed with a film of, for example, titanium, titanium nitride, or an alloy of titanium and tungsten. In a case where copper is employed as the conductor 150, 192, atoms of copper move at high speed inside silicon or silicon oxide. Particularly, in a semiconductor manufacture process, under a high temperature of approximately several hundred ° C. per hour, copper disperses in the silicon oxide and tends to cause shorting between adjacent conductors. In a case where the barrier layer 134 is provided, such shorting can be prevented or at least substantially reduced. It is to be noted that in the third example, in a case where the seed layer (FIG. 25) is formed of titanium, the seed layer 180 may serve as the barrier layer.

Although the conductors 150,192 in the above-described embodiment are disposed in a manner projecting from the top surface of the silicon wafer 110, the conductors 150, 192 may be disposed where a top surface thereof is of the same level as the top surface of the silicon wafer 110.

Although a method of manufacturing a single semiconductor package is described in the above-described embodiment, a plurality of semiconductor packages may be obtained by forming a plurality of semiconductor packages by using the above-described method, and then dicing the resultant silicon wafer 110 (semiconductor wafer) thereafter.

Further, the present invention is not limited to these embodiments, but various variations and modifications may be made without departing from the scope of the present invention.

The present application is based on Japanese priority application No. 2003-174473 filed on Jun. 19, 2003, with the Japanese Patent Office, the entire contents of which are hereby incorporated by reference.

What is claimed is:

1. A method for manufacturing a semiconductor package, the method comprising the steps of:
    attaching a bottom surface of a semiconductor wafer to a first supporting member;
    thin-filming the semiconductor wafer after the step of attaching the bottom surface of the semiconductor wafer to the first supporting member;
    forming a through hole in the semiconductor wafer after the step of thin-filming the semiconductor wafer;
    separating the semiconductor wafer from the first supporting member;
    forming an insulating layer on at least the bottom surface of the semiconductor wafer and the inner wall of the through hole;
    forming a conducting layer underneath the semiconductor wafer, the conducting layer spanning at least the bottom of the through hole; and
    forming a conductive member in the through hole and in electrical contact with the conducting layer;
    wherein the conducting layer is formed by using at least one of a metal plate and metal foil as a material for the conducting layer;
    wherein the conductive member is formed by plating;
    wherein the conductive member is formed in the through hole in a manner filling the through hole.

2. The method as claimed in claim 1, further comprising a step of removing at least a portion of the conducting layer.

3. The method as claimed in claim 2, wherein a portion of the conducting layer beneath the conducting member is left remaining in the step of removing at least a portion of the conducting layer.

4. The method as claimed in claim 1 wherein the conducting layer is a tape member.

5. The method as claimed in claim 1, wherein the through hole is formed by etching.

6. The method as claimed in claim 1, wherein the insulating layer is formed on the surface of the semiconductor wafer by forming an inorganic insulating layer on the surface of the semiconductor wafer, and forming an organic insulating layer on the surface of the inorganic insulating layer.

7. The method as claimed in claim 1, wherein a barrier layer is formed on the insulating layer subsequent to the step of forming the insulating layer.

8. A method for manufacturing a semiconductor package, the method comprising the steps of:
    attaching a bottom surface of a semiconductor wafer to a first supporting member;
    thin-filming the semiconductor wafer after the step of attaching the bottom surface of the semiconductor wafer to the first supporting member;
    forming a through hole in the semiconductor wafer after the step of thin-filming the semiconductor wafer;
    separating the semiconductor wafer from the first supporting member;
    forming an insulating layer on at least the bottom surface of the semiconductor wafer and the inner wall of the through hole;
    attaching the semiconductor wafer to a top surface of a second supporting member, the top surface spanning at least the bottom of the through hole;
    forming a conducting layer on at least the bottom of the through hole; and
    forming a conductive member in the through hole;
    wherein the conductive member is formed by plating;
    wherein the conductive member is formed in the through hole in a manner filling the through hole.

9. The method as claimed in claim 8, wherein the through hole is formed by etching.

10. The method as claimed in claim 8, wherein the insulating layer is formed on the surface of the semiconductor wafer by forming an inorganic insulating layer on the surface of the semiconductor wafer, and forming an organic insulating layer on the surface of the inorganic insulating layer.

11. The method as claimed in claim 8, wherein a barrier layer is formed on the insulating layer subsequent to the step of forming the insulating layer.

* * * * *